(12) United States Patent
Lu et al.

(10) Patent No.: US 12,542,552 B1
(45) Date of Patent: Feb. 3, 2026

(54) XOR-GATE-BASED QUADRATURE PHASE DETECTOR WITH COMPENSATION FOR DEVICE OFFSETS

(71) Applicant: Marvell Asia Pte Ltd, Singapore (SG)

(72) Inventors: Quanli Lu, Irvine, CA (US); Liang Fan, Irvine, CA (US); Afshin Mellati, Irvine, CA (US); Espen Olsen, Irvine, CA (US); Linghsiao Wang, Irvine, CA (US); Cindra Abidin, Irvine, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 47 days.

(21) Appl. No.: 18/497,775

(22) Filed: Oct. 30, 2023

Related U.S. Application Data

(60) Provisional application No. 63/419,929, filed on Oct. 27, 2022.

(51) Int. Cl.
*H03K 17/68* (2006.01)
*H03K 17/687* (2006.01)
*H03K 19/21* (2006.01)

(52) U.S. Cl.
CPC ......... *H03K 17/6871* (2013.01); *H03K 19/21* (2013.01)

(58) Field of Classification Search
CPC .................. H03K 17/6871; H03K 19/21
See application file for complete search history.

(56) References Cited

U.S. PATENT DOCUMENTS

| | | | |
|---|---|---|---|
| 5,410,270 A * | 4/1995 | Rybicki | H03F 1/303 |
| | | | 330/9 |
| 11,057,039 B1 * | 7/2021 | Kossel | H03K 21/026 |

* cited by examiner

*Primary Examiner* — Daniel C Puentes

(57) ABSTRACT

A circuit includes a plurality of differential pairs of transistors and circuitry connected to the plurality of differential pairs of transistors. The plurality of differential pairs of transistors is configured to receive a first clock and a second clock and to generate an output representing an exclusive OR sum of the first and second clocks. The circuitry is configured to compensate for mismatch between the plurality of differential pairs of transistors so that the output is zero when the first and second clocks are in quadrature with each other and the output is non-zero when the first and second clocks are not in quadrature with each other regardless of mismatch between the plurality of differential pairs of transistors.

20 Claims, 10 Drawing Sheets

| Input 1 | Input 2 | Output |
|---------|---------|--------|
| 0 | 0 | 0 |
| 0 | 1 | 1 |
| 1 | 0 | 1 |
| 1 | 1 | 0 |

**FIG. 3
PRIOR ART**

XOR-GATE-BASED QUADRATURE PHASE DETECTOR WITH COMPENSATION FOR DEVICE OFFSETS

CROSS-REFERENCE TO RELATED APPLICATION

This application claims the benefit of U.S. Provisional Application No. 63/419,929, filed on Oct. 27, 2022. The entire disclosure of the application referenced above is incorporated herein by reference.

FIELD

The present disclosure relates generally to high-speed communication systems. More particularly, the present disclosure provides a circuit and a method for improving accuracy of a quadrature clock in high-speed communication systems including compensation for device offsets.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Clock signals typically are used with circuits to propagate other signals such as data through the circuits. In general, data rates (i.e., rates of data transfer) of circuits depend on clock speed. To increase data rates, clock speed needs to be increased. However, increasing clock speed increases complexity of clock circuitry. Instead of using a single fast clock and transferring data at each rising (or falling) edge of the fast clock, two slower clock signals having a quadrature phase relationship with each other can be used to clock a circuit. Using two slower quadrature clocks, data from the circuit can be transferred at rising (or falling) edges of both the quadrature clocks and therefore at twice the speed as if using a single faster clock.

Many communication systems require quadrature clocking, where multiple phases of clock in quadrature phase relationship with each other are used to generate a modulated signal, for example. In high-speed wireline communication systems, quadrature clocking is used to replace full rate (i.e., a faster) clock to reduce power and complexity while still increasing data rates as if using a single faster clock. However, when using quadrature clocking, accurate phase relationship between the multiple phases of the quadrature clocks is essential to ensure proper performance of the communication systems.

SUMMARY

An XOR-gate based quadrature phase detector is used to detect a phase difference between quadrature clocks. Ideally, when the quadrature clocks are in a perfect quadrature phase relationship with each other, the detector provides a zero output. Conversely, when the quadrature clocks are not in a perfect quadrature phase relationship with each other (i.e., when there is a phase error or a phase difference in the quadrature relationship between the quadrature clocks), the detector provides a non-zero output. However, in practice, due to process variations in devices (e.g., transistors) used in the detector (i.e., variations in manufacturing processes used to manufacture the devices used in the detector), the detector may provide a zero output even when the quadrature clocks are not in a perfect quadrature phase relationship with each other and may provide a non-zero output when the quadrature clocks are in a perfect quadrature phase relationship with each other.

The present disclosure provides an improved XOR-gate based quadrature phase detector with circuitry designed to compensate for the process variations in the devices (e.g., transistors) used in the detector. Accordingly, the detector according to the present disclosure provides a zero output when the quadrature clocks are in a perfect quadrature phase relationship with each other and provides a non-zero output when the quadrature clocks are not in a perfect quadrature phase relationship with each other regardless of the process variations in the devices (e.g., transistors) used in the detector.

Thus, the present disclosure provides a circuit and a method for improving accuracy of quadrature clocks in high-speed communication systems. For example, the circuit comprises a high-speed quadrature detector with improved accuracy while maintaining low power for high-speed data communication applications, though other applications are possible.

In an embodiment, the present disclosure provides a circuit of a quadrature phase detector. The circuit includes a current-supply sub-circuit configured to draw a current to a first node. The circuit further includes a bottom differential-pair sub-circuit coupled to the first node and configured to pass the current through two paths and output either to a second node or a third node in response to a first clock signal in positive phase or a second clock signal in positive phase. The second clock signal and the first clock signal are opposite in phase. Additionally, the circuit includes a first chopping sub-circuit coupled to the second node and the third node and configured to redirect the current from the second node or the third node alternatively crossing to a fourth node or the fifth node in two chopping phases in response to two chopping clocks being opposite in phase. The circuit further includes a top differential-pair sub-circuit coupled to the fourth node and the fifth node and configured to pass the current at the fourth node or the fifth node to either a sixth node or a seventh node in response to a third clock signal in positive phase or a fourth clock signal in positive phase. The third clock signal and the fourth clock signal are opposite in phase. The first clock signal is a quadrature phase off from the third clock signal. Furthermore, the circuit includes a second chopping sub-circuit coupled to the sixth node and the seventh node and configured to redirect the current from the sixth node or the seventh node alternatively crossing to an eighth node or a nineth node in the two chopping phases in response to the two chopping clocks being opposite in phase. Moreover, the circuit includes a first load coupled between the eighth node and a high voltage terminal to yield a first output signal and a second load coupled between the nineth node and the high voltage terminal to yield a second output signal for detecting quadrature phase error between the first clock signal and the third clock signal.

Optionally, the current-supply sub-circuit includes a first transistor having a first terminal connected to a ground terminal, a second terminal connected to the first node, and a gate terminal supplied with a control voltage.

Optionally, the bottom differential-pair sub-circuit includes a second transistor having a first terminal connected to the first node, a second terminal connected to the second node, and a gate terminal supplied with the first clock signal; and a third transistor having a first terminal connected to the first node, a second terminal connected to the third node, and a gate terminal supplied with the second clock signal.

Optionally, the first chopping sub-circuit includes a first switch transistor having a first terminal connected to the second node, a second terminal connected to the fourth node, and a gate terminal supplied with a first chopping clock of the two chopping clocks; a second switch transistor having a first terminal connected to the third node, a second terminal connected to the fourth node, and a gate terminal supplied with a second chopping clock of the two chopping clocks which is opposite in phase to the first chopping clock; a third switch transistor having a first terminal connected to the second node, a second terminal connected to the fifth node, and a gate terminal supplied with the second chopping clock; and a fourth switch transistor having a first terminal connected to the third node, a second terminal connected to the fifth node, and a gate terminal supplied with the first chopping clock.

Optionally, the top differential-pair sub-circuit includes a fourth transistor having a first terminal connected to the fourth node, a second terminal connected to the sixth node, and a gate terminal supplied with the third clock signal; a fifth transistor having a first terminal connected to the fourth node, a second terminal connected to the seventh node, and a gate terminal supplied with the fourth clock signal; a sixth transistor having a first terminal connected to the fifth node, a second terminal connected to the sixth node, and a gate terminal supplied with the fourth clock signal; and a seventh transistor having a first terminal connected to the fifth node, a second terminal connected to the seventh node, and a gate terminal supplied with the third clock signal.

Optionally, the two chopping clocks are independent from any of the first, second, third, and fourth clock signals.

Optionally, the second chopping sub-circuit includes a fourth switch transistor having a first terminal connected to the sixth node, a second terminal connected to the eighth node, and a gate terminal supplied with the first chopping clock; a fifth switch transistor having a first terminal connected to the sixth node, a second terminal connected to the nineth node, and a gate terminal supplied with the second chopping clock; a sixth switch transistor having a first terminal connected to the seventh node, a second terminal connected to the eighth node, and a gate terminal supplied with the second chopping clock; and an eighth switch transistor having a first terminal connected to the seventh node, a second terminal connected to the nineth node, and a gate terminal supplied with the first chopping clock.

Optionally, the first chopping clock is configured to drive the first switch transistor and the fourth switch transistor in On-state in a first one of the two chopping phases and in Off-state in a second one of the two chopping phases to reverse polarity of the current in the two paths in the respective two chopping phases for a first time.

Optionally, the second chopping clock is configured to drive the second switch transistor and the third switch transistor in Off-state in the first one of the two chopping phases and in On-state in the second one of the two chopping phases to reverse polarity of the current in the two paths in the respective two chopping phases for a second time. The two chopping phases match with each other except being alternate in time.

Optionally, the first chopping sub-circuit combined with the second chopping sub-circuit is to provide opposite effect on device phase offsets generated in the bottom differential-pair sub-circuit and the top differential-pair sub-circuit during the two chopping phases.

Optionally, the first output signal includes a first voltage signal converted from a DC current pulse via the first load whenever the first clock signal and the third clock signal are all positive phase or the second clock signal and the fourth clock signal are all positive phase. The second output signal includes a second voltage signal converted from a DC current pulse via the second load whenever either one and only one of the first clock signal and the third clock signal is negative phase or either one and only one of the second clock signal and the fourth clock signal is negative phase.

In another embodiment, the present disclosure provides a clock phase calibration circuit. The calibration circuit includes a first phase shifter configured to receive a first input clock signal and adjust phase of the first input clock signal to generate a first output clock signal and a second phase shifter configured to receive a second input clock signal and adjust phase of the second input clock signal to generate a second output clock signal. Additionally, the calibration circuit includes a quadrature phase detector described herein which is configured to detect quadrature phase error between the first output clock signal and the second output clock signal and to generate an error signal. Furthermore, the calibration circuit includes a control unit configured to generate the first control signal and the second control signal based on the error signal. The first control signal and the second control signal are respectively feed-back to the first phase shifter and the second phase shifter to adjust phase of the first input clock signal and respectively adjust phase of the second input clock signal to calibrate the first output clock signal and the second output clock signal to be in quadrature with each other.

In yet another embodiment, the present disclosure provides a method for accurate quadrature clock detection. The method includes supplying a current and passing the current respectively to a first pair of paths in two opposite phases defined by a first clock signal and a second clock signal. The method further includes redirecting the current from each of the first pair of paths crossing to a second pair of paths alternatively in two chopping phases in response to two chopping clocks being opposite in phase. Additionally, the method includes passing the current at one of the second pair of paths to either one of a third pair of paths in response to a third clock signal in positive phase or a fourth clock signal in positive phase. The third clock signal and the fourth clock signal are opposite in phase and the first clock signal is a quadrature phase off from the third clock signal. The method further includes redirecting the current from each of the third pair of paths crossing to a fourth pair of paths alternatively in the two chopping phases in response to the two chopping clocks being opposite in phase. Furthermore, the method includes detecting a first output signal in a first one of the fourth pair of paths via the current on a first load in response to the first clock signal and the third clock signal being all positive phase or the second clock signal and the fourth clock signal are all positive phase. The method further includes detecting a second output signal in a second one of the fourth pair of paths via the current on a second load in response to either one and only one of the first clock signal and the third clock signal is negative phase or either one and only one of the second clock signal and the fourth clock signal is negative phase. Moreover, the method includes detecting quadrature phase error between the first clock signal and the third clock signal based on the first output signal and the second output signal.

Optionally, the step of supplying the current is controlled by applying a control voltage to a gate terminal of a first transistor behaved as a current source to supply a DC current.

Optionally, the step of redirecting the current from each of the first pair of paths crossing to the second pair of paths includes using a first and a third of four switch transistors to link a first path of the first pair of paths respectively to the second pair of paths and a second and a fourth of the four switch transistors to link a second path of the first pair of paths respectively to the second pair of paths. The first and the fourth switch transistors are controlled by a first chopping clock of the two chopping clocks to be on or off in a first chopping phase of the two chopping phases and the second and the third switch transistors are controlled by a second chopping clock of the two chopping clocks, which is opposite in phase to the first chopping clock, to be on or off in a second chopping phase of the two chopping phases.

Optionally, the step of passing the current at one of the second pair of paths to either one of the third pair of paths includes using a first and a second of four transistors to link a first path of the second pair of paths respectively to the third pair of paths and a third and a fourth of the four transistors to link a second path of the second pair of paths respectively to the third pair of paths. The first and the fourth of the four transistors are controlled by the third clock signal to be on in positive phase or off in negative phase. The second and the third of the four transistors are controlled by the fourth clock signal to be on in positive phase or off in negative phase. The fourth clock signal is opposite in phase to the third clock signal.

Optionally, the step of redirecting the current from each of the third pair of paths crossing to the fourth pair of paths comprises using a first and a second of four switch transistors to link a first path of the third pair of paths respectively to the fourth pair of paths and a third and a fourth of the four switch transistors to link a second path of the third pair of paths respectively to the fourth pair of paths. The first and the fourth switch transistors are controlled by the first chopping clock of the two chopping clocks to be on or off in the first chopping phase of the two chopping phases and the second and the third switch transistors are controlled by the second chopping clock of the two chopping clocks, which is opposite in phase to the first chopping clock, to be on or off in the second chopping phase of the two chopping phases.

Optionally, the step of redirecting the current from each of the first pair of paths crossing to a second pair of paths includes swapping polarity of the current in the second pair of paths to be opposite of that in the first pair of paths in the two chopping phases. The step of redirecting the current from each of the third pair of paths crossing to the fourth pair of paths includes swapping polarity of the current in the fourth pair of paths to be opposite of that in the third pair of paths in the two chopping phases.

Optionally, the first chopping clock matches the second chopping clock except being opposite in phase so that any errors due to device offsets generated in step of passing the current respectively to the first pair of paths and step of passing the current at one of the second pair of paths to either one of the third pair of paths during the two chopping phases are evenly applied to the first load and the second load and are averaged out. The two chopping clocks are independent from any of the first, second, third, and fourth clock signals.

In an additional embodiment, a circuit comprises a plurality of differential pairs of transistors and circuitry connected to the plurality of differential pairs of transistors. The plurality of differential pairs of transistors is configured to receive a first clock and a second clock and to generate an output representing an exclusive OR sum of the first and second clocks. The circuitry is configured to compensate for mismatch between the plurality of differential pairs of transistors so that the output is zero when the first and second clocks are in quadrature with each other and the output is non-zero when the first and second clocks are not in quadrature with each other regardless of mismatch between the plurality of differential pairs of transistors.

In other features, the plurality of differential pairs of transistors comprises a first differential pair of transistors connected to a current source and configured to receive the first clock, and second and third differential pairs of transistors cross-coupled to each other and configured to receive the second clock. The circuitry comprises fourth and fifth differential pairs of transistors cross-coupled to each other and interposed between the first differential pair of transistors and the second and third differential pairs of transistors, and sixth and seventh differential pairs of transistors cross-coupled to each other and interposed between the second and third differential pairs of transistors and respective loads connected to a voltage source. The fourth and fifth differential pairs of transistors being clocked by a third clock. The sixth and seventh differential pairs of transistors are clocked by the third clock. The third clock clocks the fourth, fifth, sixth, and seventh differential pairs of transistors to generate an output across the loads that is zero when the first and second clocks are in quadrature with each other and that is non-zero when the first and second clocks are not in quadrature with each other.

In other features, the third clock clocks the fourth, fifth, sixth, and seventh differential pairs of transistors to generate the output across the loads that is zero indicating that the first and second clocks are in quadrature with each other and that is non-zero indicating that the first and second clocks are not in quadrature with each other regardless of mismatch between the first differential pair of transistors.

In other features, the third clock clocks the fourth, fifth, sixth, and seventh differential pairs of transistors to generate the output across the loads that is zero when the first and second clocks are in quadrature with each other and that is non-zero when the first and second clocks are not in quadrature with each other regardless of mismatch between the second and third differential pairs of transistors.

In other features, the third clock switches the fourth and fifth differential pairs of transistors to direct current from the current source and the second and third differential pairs of transistors to the fourth and fifth differential pairs of transistors to compensate for mismatch between the first differential pair of transistors.

In other features, the third clock switches the sixth and seventh differential pairs of transistors to direct the current from the second and third differential pairs of transistors to the respective loads to compensate for mismatch between the second and third differential pairs of transistors.

In other features, the first clock input to the first differential pair of transistors and the second clock input to the second and third differential pairs of transistors have respective frequencies that are different from a frequency of the third clock input to the fourth, fifth, sixth, and seventh differential pairs of transistors.

In other features, the circuit further comprises a clock generator configured to generate the third clock having a 50% duty cycle and a slower frequency than the first and second clocks.

In other features, the circuit further comprises a clock generator configured to generate the third clock so that the first and second clocks have a frequency that is an integer multiple of a frequency of the third clock.

In other features, the circuit further comprises a calibration circuit configured to adjust a phase of at least one of the first and second clocks based on the output when the output is non-zero.

In a further embodiment, a method for mismatch compensation comprises receiving a first clock and a second clock at a plurality of differential pairs of transistors to generate an output representing an exclusive OR sum of the first and second clocks. The method comprises compensating mismatch between the plurality of differential pairs of transistors so that the output is zero when the first and second clocks are in quadrature with each other and the output is non-zero when the first and second clocks are not in quadrature with each other regardless of mismatch between the plurality of differential pairs of transistors.

In other features, the plurality of differential pairs of transistors comprises first, second, and third differential pairs of transistors, and the method further comprises receiving the first clock at the first differential pair of transistors connected to a current source, and receiving the second clock at the second and third differential pairs of transistors cross-coupled to each other. The method further comprises interposing fourth and fifth differential pairs of transistors cross-coupled to each other between the first differential pair of transistors and the second and third differential pairs of transistors, and clocking the fourth and fifth differential pairs of transistors by a third clock. The method further comprises interposing sixth and seventh differential pairs of transistors cross-coupled to each other between the second and third differential pairs of transistors and respective loads connected to a voltage source, and clocking the sixth and seventh differential pairs of transistors by the third clock. The method further comprises clocking the fourth, fifth, sixth, and seventh differential pairs of transistors by the third clock to generate an output across the loads that is zero when the first and second clocks are in quadrature with each other and that is non-zero when the first and second clocks are not in quadrature with each other.

In other features, the method further comprises clocking the fourth, fifth, sixth, and seventh differential pairs of transistors by the third clock to generate the output across the loads that is zero indicating that the first and second clocks are in quadrature with each other and that is non-zero indicating that the first and second clocks are not in quadrature with each other regardless of mismatch between the first differential pair of transistors.

In other features, the method further comprises clocking the fourth, fifth, sixth, and seventh differential pairs of transistors by the third clock to generate the output across the loads that is zero when the first and second clocks are in quadrature with each other and that is non-zero when the first and second clocks are not in quadrature with each other regardless of mismatch between the second and third differential pairs of transistors.

In other features, the method further comprises switching the fourth and fifth differential pairs of transistors by the third clock to direct current from the current source and the second and third differential pairs of transistors to the fourth and fifth differential pairs of transistors to compensate for mismatch between the first differential pair of transistors.

In other features, the method further comprises switching the sixth and seventh differential pairs of transistors by the third clock to direct the current from the second and third differential pairs of transistors to the respective loads to compensate for mismatch between the second and third differential pairs of transistors.

In other features, the method further comprises supplying the first clock to the first differential pair of transistors and the second clock to the second and third differential pairs of transistors having respective frequencies that are different from a frequency of the third clock input to the fourth, fifth, sixth, and seventh differential pairs of transistors.

In other features, the method further comprises generating the third clock having a 50% duty cycle and a slower frequency than the first and second clocks.

In other features, the method further comprises generating the third clock so that the first and second clocks have a frequency that is an integer multiple of a frequency of the third clock.

In other features, the method further comprises adjusting a phase of at least one of the first and second clocks based on the output when the output is non-zero.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 3 is a truth table of an XOR gate.

In the drawings, reference numbers may be reused to identify similar and/or identical elements.

DESCRIPTION

Phase accuracy of a typical clock generation system may not be sufficient for high-speed communication systems. The accuracy may be degraded by device mismatch due to variations in CMOS manufacturing processes and may be further degraded by clock buffering typically used in communication systems. A digital/analog calibration subsystem to improve accuracy may be used to satisfy system requirements. In many wireless communication systems, the calibration subsystem is implemented digitally because data rates are generally low, and analog-to-digital converters (ADCs) and digital-to-analog converters (DACs) can be easily implemented for detecting and compensating errors to achieve high accuracy. However, data rates of wireline communication systems are typically pushed to highest possible data rates (e.g., on the order of tens of GHz), and high-speed high-accuracy converters based on a single conventional clock became cost prohibitive for digital clock calibration purposes. Analog quadrature calibration is typically employed in such communication systems.

Figure 1:
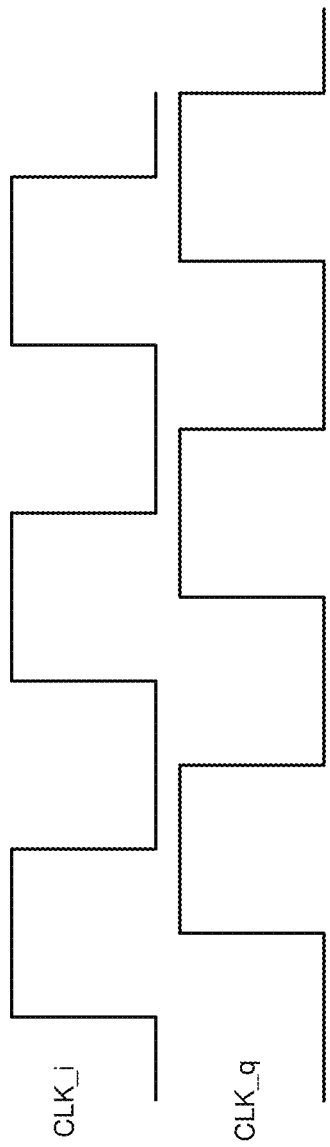
FIG. 1 is a simplified waveform diagram of two clocks in quadrature with each other.

To calibrate the quadrature clock using an analog calibration subsystem, the performance of quadrature detector is very critical. The calibration accuracy is usually limited by the accuracy of the quadrature detector. Commonly used quadrature detectors comprise XOR gates. However, device mismatch in the XOR gates tends to limit the accuracy of quadrature error detection. FIG. 1 shows two clocks perfectly aligned in quadrature with each other. As used herein, clocks that are in perfect quadrature with each other have phases exactly 90 degrees apart (i.e., a phase difference between phases of two clocks perfectly aligned in quadrature with each other is 90 degrees). When device mismatch exists, the average output of the quadrature detectors comprising XOR gates is non-zero even when input clocks are perfectly aligned in quadrature. Therefore, the present disclosure provides an advanced analog circuit and a method for improving the accuracy of the XOR-gate-based quadrature detector notwithstanding device mismatches in the detector.

Figure 2:
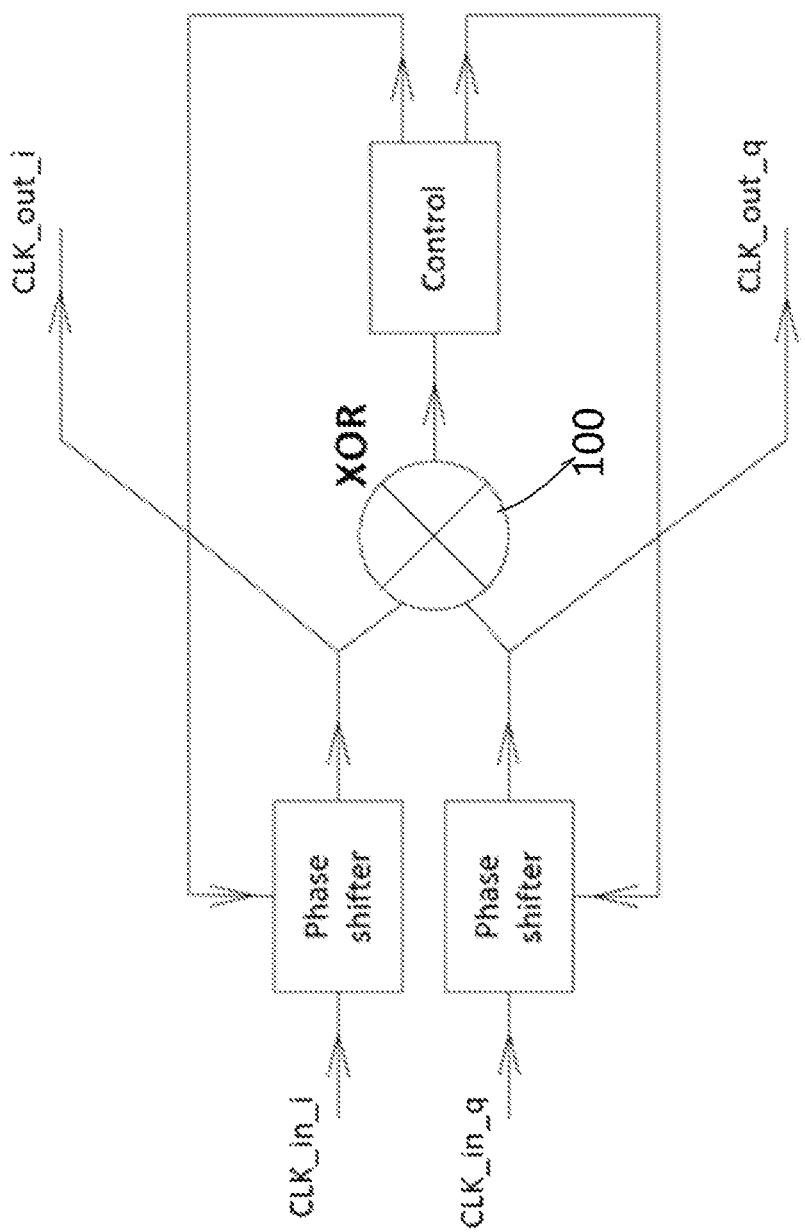
FIG. 2 is a simplified block diagram of a calibration circuit based on an XOR quadrature detector.

FIG. 2 shows a simplified block diagram of a calibration circuit comprising an XOR gate as quadrature detector (100). As shown, two clocks which are supposed to be in quadrature with each other are inputted into the calibration circuit. If the two clocks are perfectly in quadrature with each other, one clock is an in-phase (i) component and the other clock is a quadrature (q) component. A pair of phase shifters respectively receive the two clock signals, CLK_in_i and CLK_in_q, as inputs. Each phase shifter is designed to adjust the phase of respective clock signal so that two output clock signals, CLK_out_i and CLK_out_q, will be closer to being perfectly in quadrature with each other. The phase accuracy of these clock signals is detected by the XOR-gate-based detector 100.

An XOR gate is a digital logic gate that gives a true (1 or HIGH) output when the number of true inputs is odd. An XOR gate implements and exclusive OR gate; that is, a true output results if one, and only one, of the inputs to the gate is true. If both inputs are false (0/LOW) or both are true, a false output results. FIG. 3 shows a truth table of an XOR gate. The XOR gate represents an inequality function, i.e., the output is true if the inputs are not alike in phase; otherwise, the output is false. So, the XOR gate detector 100 can determine if the phases between the two clocks are accurately in-phase or offset by one-quarter cycle.

Figure 4A:
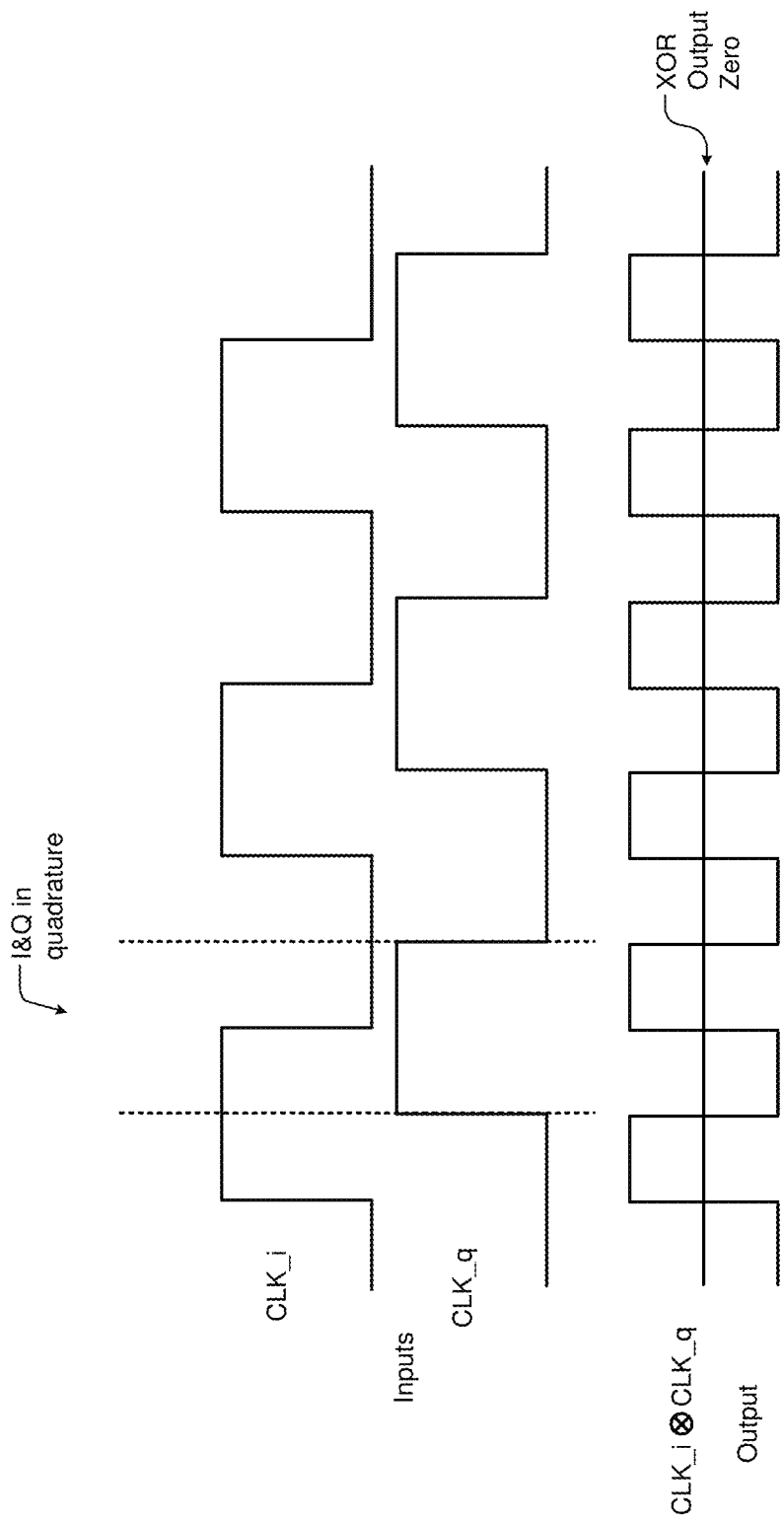
FIG. 4A is a simplified waveform diagram of input/output of an XOR gate as quadrature detector when I clock and Q clock are perfectly in quadrature.
Figure 4B:
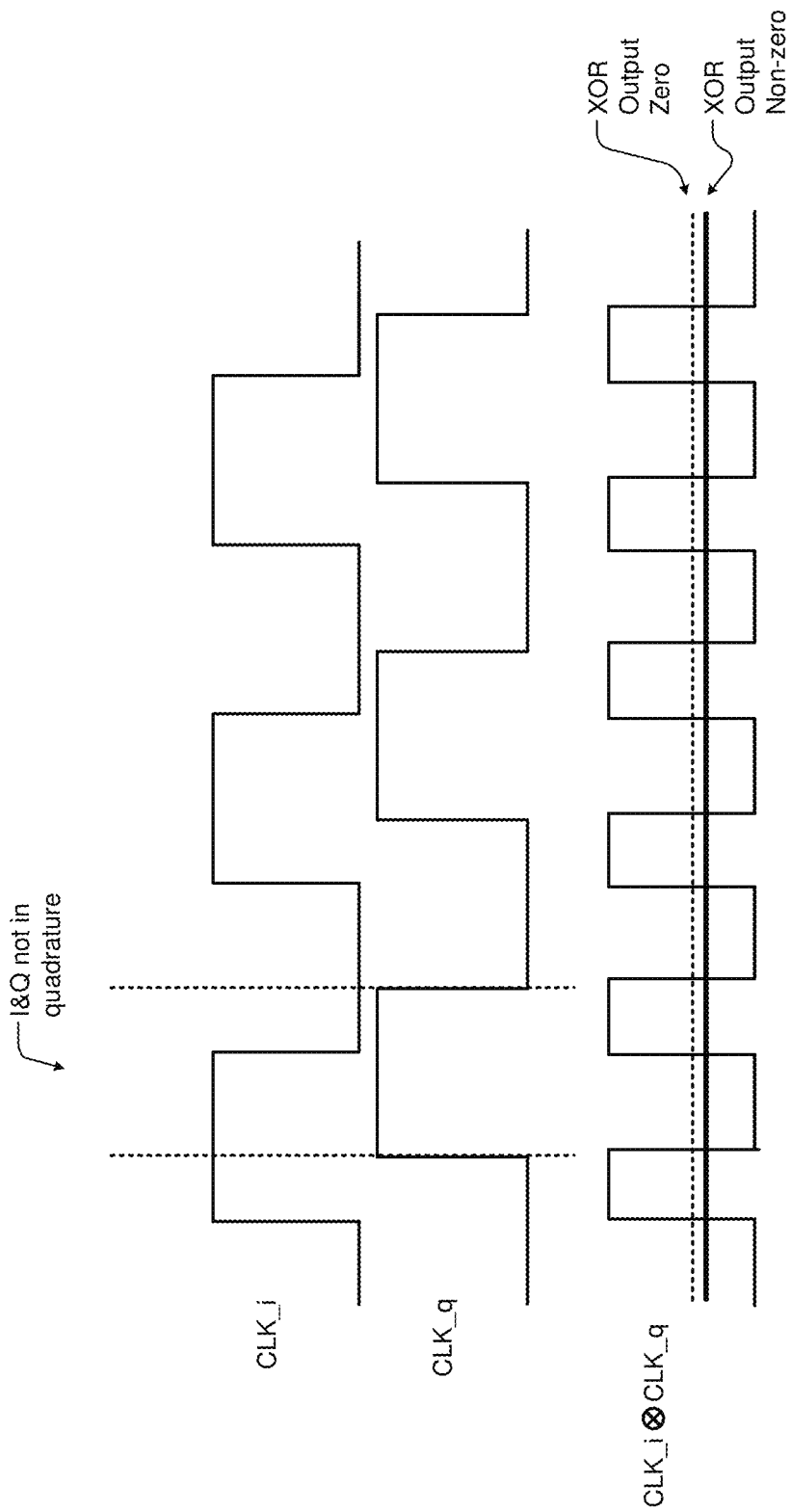
FIG. 4B is a simplified waveform diagram of input/output of an XOR gate as quadrature detector when I clock and Q clock are not perfectly in quadrature.
Figure 4C:
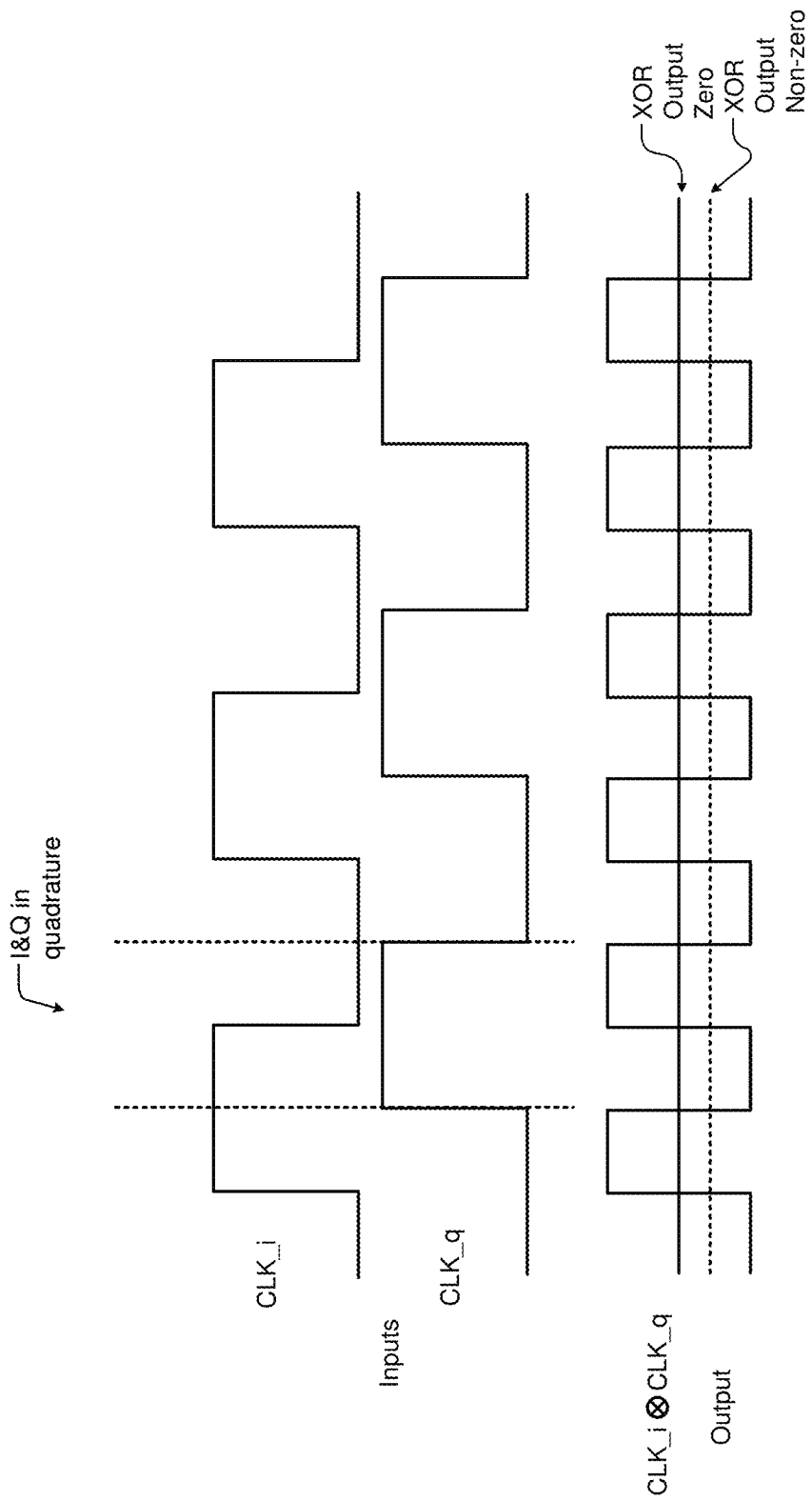
FIG. 4C is a simplified waveform diagram of input/output of an XOR gate as quadrature detector when I clock and Q clock are perfectly in quadrature and the output of the XOR gate is non-zero due to device offsets.
Figure 4D:
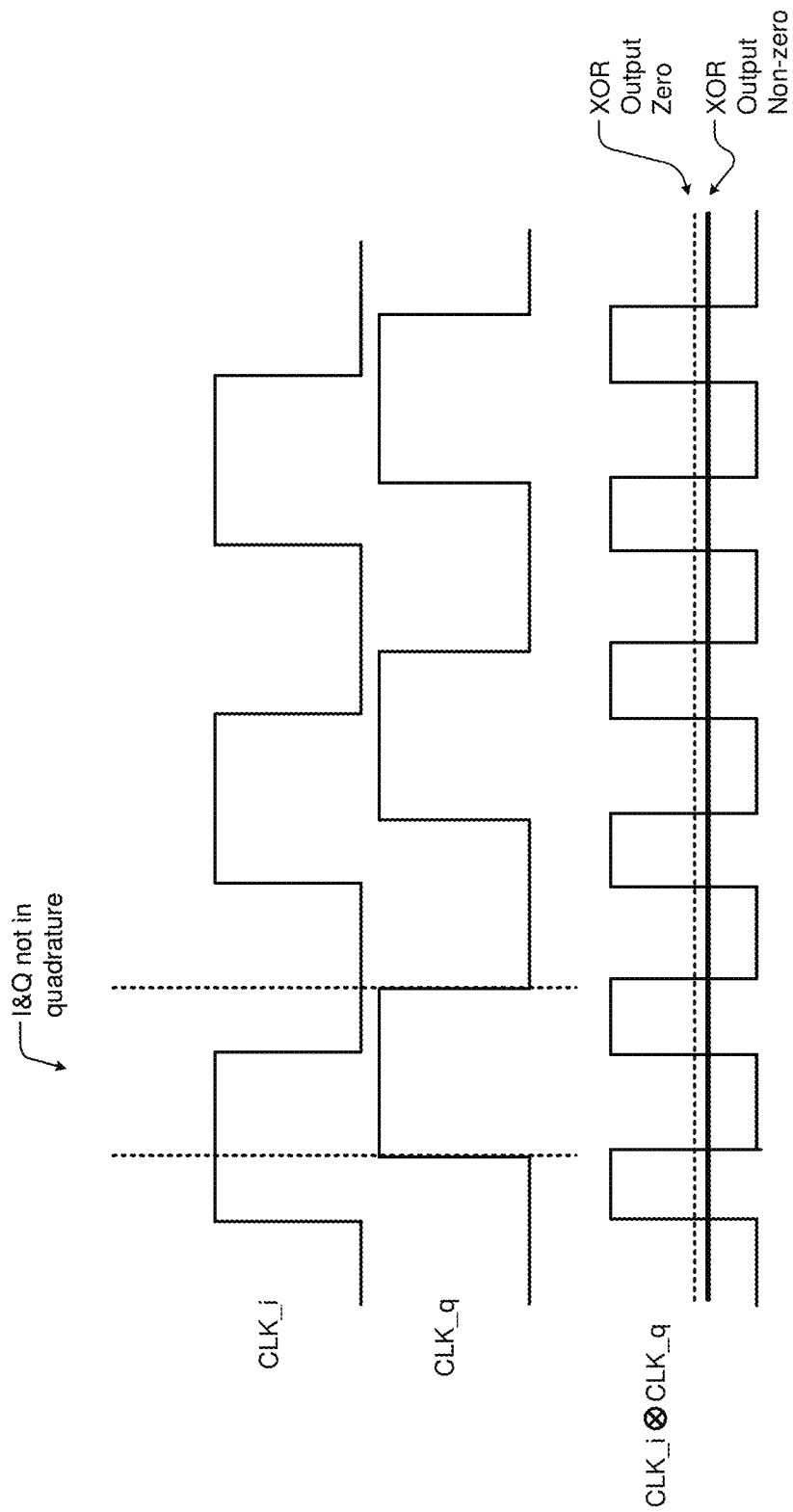
FIG. 4D is a simplified waveform diagram of input/output of an XOR gate as quadrature detector when I clock and Q clock are not perfectly in quadrature alignment and the output of the XOR gate is zero due to device offsets.

FIG. 4A shows waveforms of input clock signals and output of an XOR gate used as a quadrature phase detector. In FIG. 4A, when the I clock and quadrature Q clock are perfectly in quadrature, the average output is zero. If the two clocks are not perfectly in quadrature with each other, as shown in FIG. 4B, the average output will have a non-zero DC value proportional to a phase error between the two clocks. The XOR-gate-based detector is configured to detect the phase error and generate an error signal proportional to the phase error. FIG. 4C shows when the I clock and quadrature Q clock are in perfect quadrature and yet the average output, which should be zero, is non-zero due to a device mismatch in the XOR-gate-based detector. FIG. 4D shows when the I clock and quadrature Q clock are not in perfect quadrature and yet the average output, which should be non-zero, is zero due to a device mismatch in the XOR-gate-based detector. The calibration circuit includes a control circuit configured to receive the error signal and generate respective feedback signals that are fed back to the respective phase shifters to re-adjust the phases of the two input clock signals to have the two output clock signals calibrated to be in perfect quadrature with each other. However, the device mismatch in the XOR gate can limit the accuracy of quadrature error detection. If device mismatch exists, the average output will be non-zero even when the input clocks are perfectly in quadrature with each other as seen in FIG. 4D.

Figure 5C:
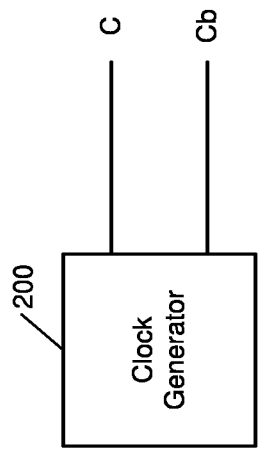
FIG. 5C is an example of a clock generator used with the XOR-gate-based quadrature phase detector of FIG. 5B.
Figure 5A:
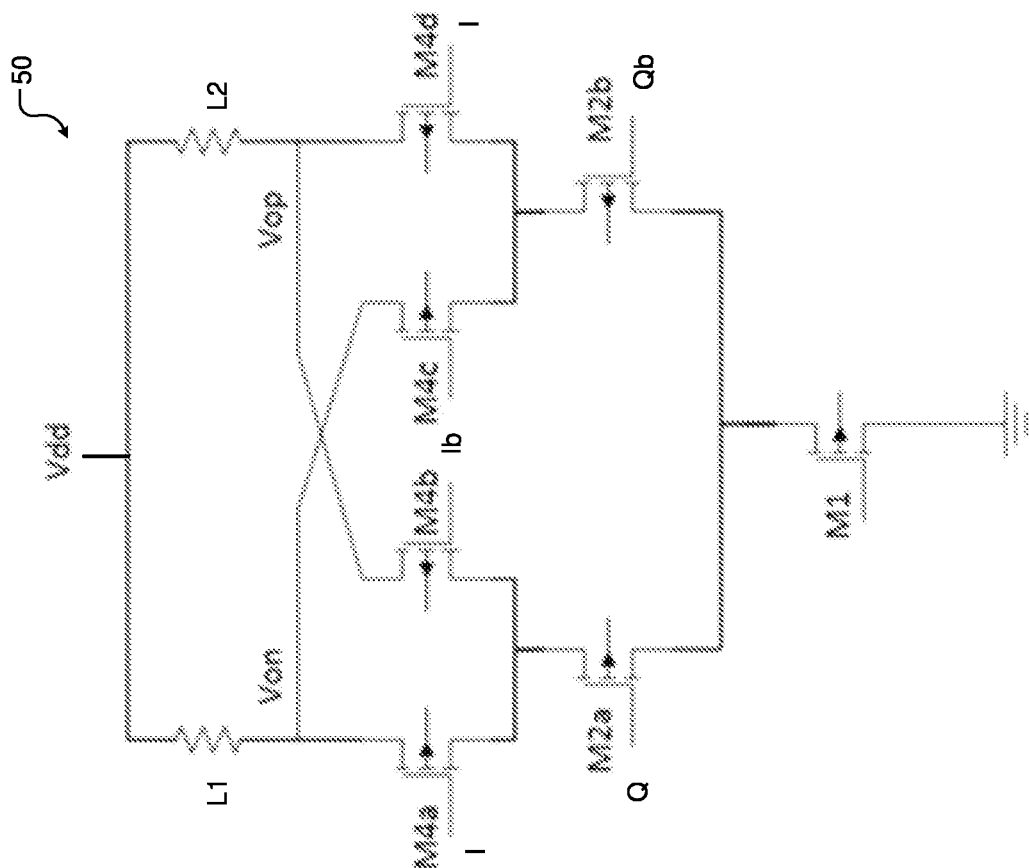
FIG. 5A is a circuit diagram of an XOR-gate-based quadrature phase detector without compensation for device offsets.

FIG. 5A shows an XOR-gate based quadrature phase detector 50 for detecting a phase error (or a phase difference) in the quadrature relationship between quadrature clocks I and Q (which are 90 degrees apart in phase from each other). The detector 50 comprises an XOR gate formed by a first differential pair of transistors M2a and M2b connected to a current source provided by a transistor M1 connected to ground, and by a second differential pair of transistors M4a, M4b and a third differential pair of transistors M4c, M4d, where the second and third differential pairs of transistors are cross-coupled and connected to respective loads L1 and L2. The loads L1 and L2 are connected to a voltage source Vdd. The quadrature clocks I and Q are input to the detector 50. The detector 50 detects a phase error in the quadrature relationship between quadrature clocks I and Q as follows.

The clock signals Q and Qb (or Q-bar, which is an inverted or complementary clock signal Q) are input to transistors M2a and M2b, respectively. The clock signal I is input to transistors M4a and M4d, and the clock signal Ib (or I-bar, which is an inverted or complementary clock signal I) is input to transistors M4b and M2c. The I clock (I and Ib) toggles the transistors in the second and third differential pairs such that the Q clock (Q and Qb) passes through the load L1 for a first half cycle of the Q clock and through the load L2 for a second half cycle of the Q clock. The outputs across the loads L1 and L2 are added or summed to provide the XOR'ed result of the I and Q clocks, which provides the phase error in the quadrature relationship between quadrature clocks I and Q.

If the transistors M2a and M2b do not have device offsets, the transistors M2a and M2b will split the current from the current source M1 exactly 50-50 to the second and third differential transistor pairs. Further, if the transistors in the second and third differential pairs do not have device offsets, the output of the XOR gate will be zero if the quadrature clocks I and Q are perfectly in quadrature as shown in FIG. 4A and non-zero if the quadrature clocks I and Q are not in quadrature as shown in FIG. 4B. However, in practice, the transistors M2a and M2b will have some device offset due to process variations. Therefore, the transistors M2a and M2b will not split the current from the current source M1 exactly 50-50 to the second and third differential transistor pairs even if the quadrature clocks I and Q are perfectly in quadrature. Further, the transistors in the second and third differential pairs will also have device offsets. Therefore, the output of the XOR gate will not be zero even if the quadrature clocks I and Q are perfectly in quadrature as shown in FIG. 4C and may be zero even if the quadrature clocks I and Q are not perfectly in quadrature as shown in FIG. 4D.

Figure 5B:
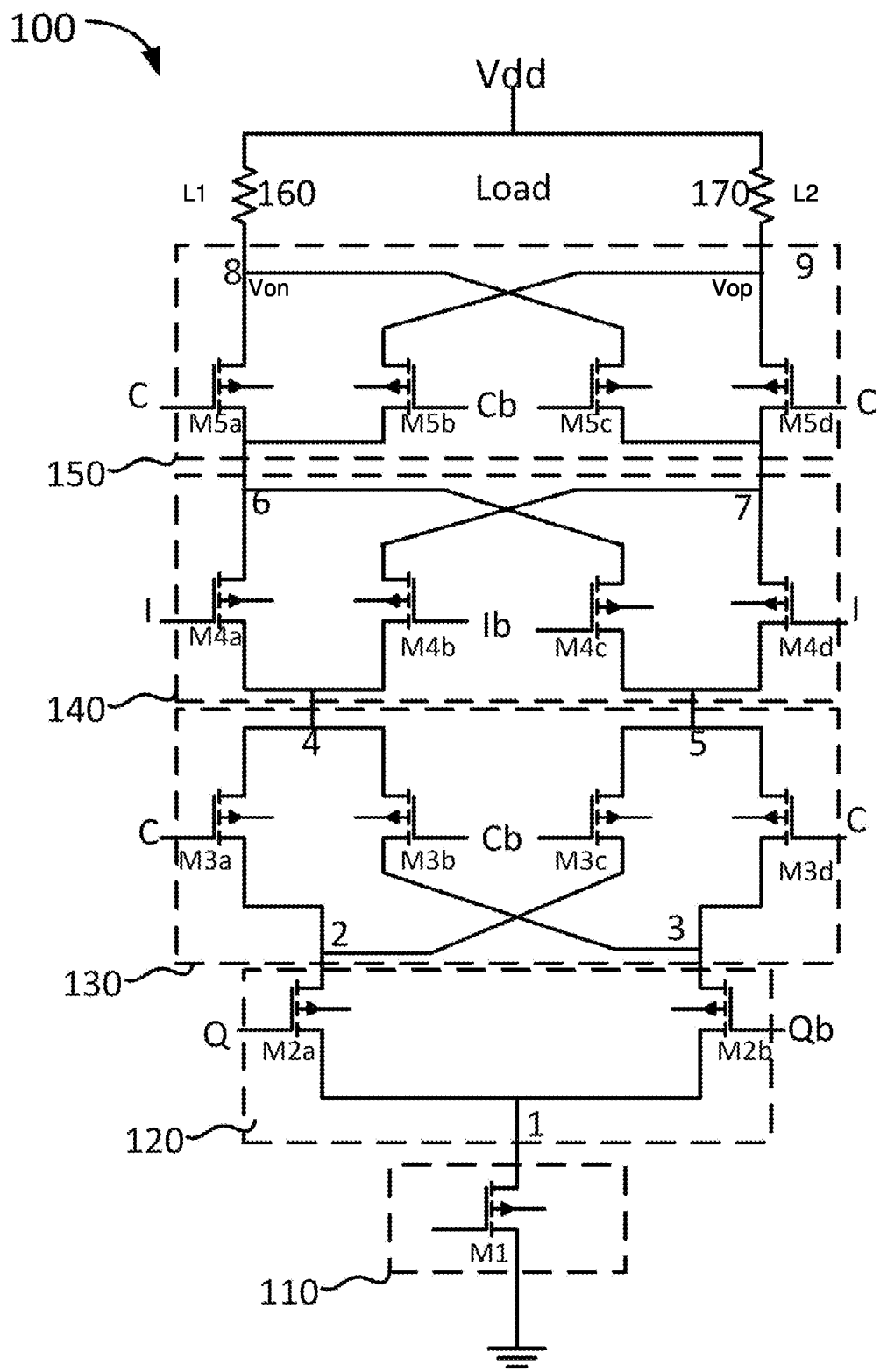
FIG. 5B is a circuit diagram of an XOR-gate-based quadrature phase detector with compensation for device offsets.

Accordingly, in the detector 100 shown in FIG. 5B, in order to compensate for the device offsets in the first differential pair of transistors M2a and M2b, a fourth differential pair of transistors M3a, M3b and a fifth differential pair of transistors M3c, M3d are added (stacked) between the first differential pair of transistors M2a, M2b and the second and third differential pairs of transistors M4a-M4d. Further to compensate for the device offsets in the second and third differential pairs of transistors M4a-M4d, a sixth differential pair of transistors M5a, M5b and a seventh differential pair of transistors M5c, M5d are added (stacked) between the second and third differential pairs of transistors M4a-M4d and first and second loads 160, 170.

Thus, in the detector 100 shown in FIG. 5B, the current source M1 is connected to the first differential pair of transistors M2a and M2b. The first differential pair of transistors M2a and M2b are connected to fourth differential pair of transistors M3a, M3b and a fifth differential pair of transistors M3c, M3d, respectively. The fourth differential pair of transistors M3a, M3b and the fifth differential pair of transistors M3c, M3d are cross-coupled. The fourth differential pair of transistors M3a, M3b and the fifth differential pair of transistors M3c, M3d are connected to the second differential pair of transistors M4a, M4b and the third differential pair of transistors M4c, M4d, respectively. The second and third differential pairs of transistors M4a-M4d are also cross-coupled. The second and third differential pairs of transistors M4a-M4d are connected to the sixth and seventh differential pairs of transistors M5a-M5d, which are also cross-coupled. The sixth and seventh differential pairs of transistors M5a-M5d are connected to the first and second loads 160, 170, respectively.

The Q clock signal (Q and Qb) is input to the first differential pair of transistors M2a and M2b, respectively. The clock signal I is input to transistors M4a and M4d, and the clock signal Ib is input to transistors M4b and M4c. The fourth and fifth differential pairs of transistors M3a-M3d (called the first chopping switches) and the sixth and seventh differential pairs of transistors M5a-M5d (called the second chopping switches) and are clocked using a chopping clock C and Cb (or C-bar, which is an inverted or complementary chopping clock signal C). Specifically, the chopping clock signal C is input to transistors M3a, M3d, M5a, M5d and the chopping clock signal Cb is input to transistors M3b, M3c, M5b, M5c. The chopping clock C is independent of and is slower than the I and Q clocks. For example, a frequency of the I and Q clocks is an integer multiple of a frequency of the chopping clock C.

The chopping clock C and Cb toggles the transistors M3a-3d (the first chopping switches) such that when transistor M2a is on, the Q clock passes through transistors M3a and M3d to both left and right branches of the detector 100, and when transistor m2b is on, the Qb clock passes through transistors M3b and M3c to both left and right branches of the detector 100. Thus, any device offsets (i.e., strength and weakness caused by process variations) in transistors M2a and M2b are reflected in the Q clock passing through both left and right branches of the detector 100 to the second and third differential pairs of transistors M4a-M4d. Additionally, the chopping clock C and Cb toggles the transistors M5a-5d (the second chopping switches) such that the I clock passes through transistors M5a and M5d to both left and right branches of the detector 100, and the Ib clock passes through transistors M5b and M5c to both left and right branches of the detector 100. Thus, any device offsets (i.e., strength and weakness caused by process variations) in transistors M4a-M4d are reflected in the I clock passing through both left and right branches of the detector 100 to the first and second loads 160, 170. Since the device offsets of transistors M2a and M2b are reflected in the Q clock passing through both left and right branches of the detector 100 and since the device offsets of transistors M4a-M4d are reflected in the I clock passing through both left and right branches of the detector 100, these device offsets eventually cancel each other out when the Q clock and the I clock are summed (added) at the outputs Von and Vop, which are the result of the XOR operation performed by the detector 100 on the Q and I clocks.

For example, suppose that Q is high and Qb is low. Transistor M2a is on, and transistor M2b is off. When C is high, transistors M3a and M3d are on. Therefore, Q will flow not only through transistor M3a into the left branch of the detector 100 but will also flow through transistor M3d into the right branch of the detector 100. The additional current flow through transistor M3d into the right branch of the detector 100 compensates for any mismatch in transistors M2a and M2b. Similarly, when C is low, transistors M3b and M3c are on. Therefore, Q will flow not only through transistor M3b into the left branch of the detector 100 but will also flow through transistor M3c into the right branch of the detector 100. The additional current flow through transistor M3c into the right branch of the detector 100 compensates for any mismatch in transistors M2a and M2b. Similarly, Q will flow through the left and right branches of the detector 100 when C is low. Further, Qb will also similarly flow through both left and right branches of the detector 100 as C toggles the transistors M3a-M3d. Similar operations occur when C is low and Cb is high. Similar operations occur when Q is low and Qb is high (i.e., when M2a is off, and transistor M2b is on). Thus, regardless of the mismatch (i.e., device offsets) between transistors M2a and M2b, since the Q clock passes through both the left and right branches of the detector 100, the differences in currents caused by the mismatch between transistors M2a and M2b are reflected in both the left and right branches of the detector 100.

Similar results are obtained for the I clock when the C clock toggles the switches M5a-M5d, and the differences in currents caused by the mismatch between transistors M4a-M4d are reflected in both the left and right branches of the detector 100. Over time (i.e., in a few cycles of the C clock), these differences eventually (over time) average out and cancel out when the Q clock and the I clock are summed (added) at the outputs Von and Vop, which are the result of the XOR operation performed by the detector 100 on the Q and I clocks. Thus, the C clock and the first and second chopping switches M3a-M3d and M5a-M5d compensate for any device offsets in transistors M2a, M2b, and M4a-M4d constituting the XOR gate of the detector 100. Note that so long as the C clock maintains a 50% duty cycle, the number of times the I and Q clocks toggle during a half cycle of the C clock is immaterial and the compensation for the device offsets is achieved in the XOR operation due averaging over a few cycles of the C clock.

Thus, due to the compensation for device offsets provided by first and second chopping switches M3a-M3d and M5a-M5d, the quadrature phase detector 100 correctly detects when there is a phase difference in the quadrature phase relationship between the I and Q clocks. The quadrature phase detector 100 provides a zero output when the I and Q clocks are in a perfect quadrature phase relationship and provides a non-zero output only when the I and Q clocks are not in a perfect quadrature phase relationship (i.e., when there is a phase difference in the quadrature phase relationship between the I and Q clocks). Accordingly, the phase shifters shown in FIG. 2 correct the phase of the I and/or Q clocks only when the quadrature phase detector 100 provides a non-zero output regardless of the device offsets in transistors M2a, M2b, and M4a-M4d. The circuit shown in FIG. 2 corrects the phase(s) of the I and/or Q clocks only when the quadrature phase detector 100 provides a non-zero output regardless of the device offsets in transistors M2a, M2b, and M4a-M4d.

In an aspect, the present disclosure provides an improved XOR-gate detector enabled for detecting high-speed quadrature error more accurately while maintaining low power. FIG. 5B shows a circuit diagram of an XOR-gate-based quadrature detector according to an embodiment of the present disclosure. The XOR-gate quadrature detector 100 is provided as a circuit based on a chopped Gilbert Cell type XOR gate operating in current mode. The XOR-gate quadrature detector 100 includes a current-supply sub-circuit 110 with a first transistor M1 operated as the current source for the chopped Gilbert Cell. The first transistor M1 has a first terminal connected to ground and a second terminal connected to a first node 1. A gate terminal of the first transistor M1 controls current supply. Optionally, a control voltage is applied to the gate terminal to turn on the first transistor M1. For example, the first transistor M1 is a P-channel MOSFET transistor, or a N-channel MOSFET transistor.

The chopped Gilbert Cell includes a bottom differential-pair sub-circuit 120 comprising a second transistor M2a and a third transistor M2b. The bottom differential-pair sub-circuit 120 is coupled to the current-supply sub-circuit 110 via a second node 2 and a third node 3. The second transistor M2a has a first terminal coupled to the first node 1, a second terminal coupled to the second node 2, and a gate terminal supplied with a clock signal Q, which is a positive quadrature Q clock. The third transistor M2b has a first terminal coupled to the first node 1, a second terminal coupled to the second node 3, and a gate terminal supplied with a clock signal Qb, which is a negative quadrature Qb clock. The Qb clock is opposite in phase, or offset by one-half of period, relative to the Q clock. In current mode, the Q clock or the Qb clock in respective phase turns on the second or third transistor to form a conducting path from the first terminal to the second terminal of the second or third transistor to allow a current flow from the first node 1 to the second node 2 or from the first node 1 to the third node 3. Optionally, each of the second transistor M2a and the third transistor M2b is a PMOS transistor, or a NMOS transistor, or a P-channel MOSFET transistor, or a N-channel MOSFET transistor.

The XOR-gate quadrature detector 100 further includes a first chopping sub-circuit 130 comprising four switch transistors M3a, M3b, M3c, and M3d. The first chopping sub-circuit 130 is coupled to the bottom differential-pair sub-circuit 120 via a fourth node 4 and a fifth node 5. As shown, a first switch transistor M3a has a first terminal connected to the second node 2, a second terminal connected to the fourth node 4, and a gate terminal supplied with a chopping clock signal C to switch the first switch transistor M3a on or off. A second switch transistor M3b has a first terminal connected to the third node 3, a second terminal connected to the fourth node 4, and a gate terminal supplied with another chopping clock signal Cb to switch the second switch transistor M3b on or off. Similarly, a third switch transistor M3c has a first terminal connected to the second node 2, a second terminal connected to the fifth node 5, and a gate terminal supplied with the chopping clock signal Cb to switch the third switch transistor M3c on or off. A fourth switch transistor M3d has a first terminal connected to the third node 3, a second terminal connected to the fifth node 5, and a gate terminal supplied with the chopping clock signal C to switch the fourth switch transistor M3d on or off.

In an embodiment, the chopping switch (e.g., M3a or M3d) driven by the chopping clock signal C is on while the chopping switch (e.g., M3b or M3c) driven by the chopping clock signal Cb is off. Chopping is often used in low offset op-amp designs to swap the positive and negative input and output periodically. For half of the time, the device offset may generate a positive output; and for the other half of the time, the device offset will generate a negative output. If the chopping clock (C or Cb) maintains a good duty cycle, the offset effect will cancel out by average over time. An additional effect of the first chopping sub-circuit 130 is to swap signal polarity from negative to positive in the XOR gate. Optionally, each of the switch transistors M3a, M3b, M3c, and M3d is a PMOS transistor, or a NMOS transistor, or a P-channel MOSFET transistor, or a N-channel MOSFET transistor.

The XOR-gate quadrature detector 100, operating as a chopped Gilbert Cell, further includes a top differential-pair sub-circuit 140 comprising a first differential pair of transistors M4a and M4b and a second differential pair of transistors M4c and M4d. The top differential-pair sub-circuit 140 is separated from the bottom differential-pair sub-circuit 120 by the first chopping sub-circuit 130. The top differential-pair sub-circuit 140 is coupled to the first chopping sub-circuit 130 via a sixth node 6 and a seventh node 7. As shown, a fourth transistor M4a has a first terminal connected to the fourth node 4, a second terminal connected to the sixth node 6, and a gate terminal supplied with a clock signal I, which is a positive in-phase I clock with a quarter of period off relative to the quadrature Q clock. A fifth transistor M4b has a first terminal connected to the fourth node 4, a second terminal connected to the seventh node 7, and a gate terminal supplied with a clock signal Ib, which is a negative in-phase Ib clock with an opposite phase relative to the I clock. A sixth transistor M4c has a first terminal connected to the fifth node 5, and a second terminal connected to the sixth node 6, and a gate terminal supplied with the clock signal Ib. A seventh transistor M4d has a first terminal connected to the fifth node 5, a second terminal connected to the seventh node 7, and a gate terminal supplied with the clock signal I. The top differential-pair sub-circuit 140 works together with the bottom differential-pair sub-circuit 120 as an XOR gate to process a pair of input I clock and Q clock signals in quadrature with each other in differential form to generate an output signal in differential form of the two clock signals in quadrature with each other. If there is a phase error in the input I clock and Q clock, the averaged output signal will be a non-zero value. Optionally, each of the transistors M4a, M4b, M4c, and M4d is a P-channel MOSFET transistor, or a N-channel MOSFET transistor.

The XOR-gate quadrature detector 100 includes a second chopping sub-circuit 150 comprising additional four switch transistors M5a, M5b, M5c, and M5d. The second chopping sub-circuit 150 is coupled to the top differential-pair sub-circuit 140 via an eighth node 8 and a nineth node 9. As shown, a fifth switch transistor M5a has a first terminal connected to the sixth node 6, a second terminal connected to the eighth node 8, and a gate terminal supplied with a chopping clock signal C to switch the fifth switch transistor M5a on or off. The eight node 8 is connected to a first load 160, which is connected to a high voltage Vdd terminal. A sixth switch transistor M5b has a first terminal connected to the sixth node 6, a second terminal connected to the nineth node 9, and a gate terminal supplied with another chopping clock signal Cb to switch M5b on or off. The ninth node 9 is connected to a second load 170, which is connected to the high voltage Vdd terminal. Similarly, a seventh switch transistor M5c has a first terminal connected to the seventh node 7, a second terminal connected to the eighth node 8, and a gate terminal supplied with the chopping clock signal Cb to switch the seventh switch transistor M5c on or off. An eighth switch transistor M5d has a first terminal connected to the seventh node 7, a second terminal connected to the nineth node 9, and a gate terminal supplied with the chopping clock signal C to switch the eighth switch transistor M5d on or off.

In the embodiment, similar to the first chopping sub-circuit 130, the second chopping sub-circuit 150 is also configured to cancel out any device offset effect by averaging over time if the chopping clock (C or Cb) maintains a good duty cycle. Additionally, the second chopping sub-circuit 150 also swaps signal polarity from negative to positive in the XOR gate. Therefore, as the first chopping sub-circuit 130 changes the polarity once, the second chopping sub-circuit 150 changes the polarity back to make the functionality of the chopped Gilbert Cell operate the same as a normal XOR gate in detecting the quadrature clocks. Optionally, each of the switch transistors M5a, M5b, M5c, and M5d is a PMOS transistor, or a NMOS transistor, or a P-channel MOSFET transistor, or a N-channel MOSFET transistor. Optionally, each of the first load 160 and the second load 170 is a resistor. Optionally, the first chopping clock C and the second chopping clock Cb are independent from any of the I clock, Q clock, Ib clock, and Qb clock signals. The two chopping phases are configured to be matched.

FIG. 5C shows an example of a clock generator 200 that generates the first chopping clock C and the second chopping clock Cb. For example, the clock generator 200 generates the first chopping clock C and the second chopping clock Cb having a 50% duty cycle and a slower frequency than the I clock and the Q clock. For example, the clock generator 200 generates the first chopping clock C and the second chopping clock Cb such that the frequency of the I clock and the Q clock is an integer multiple of a frequency of the first chopping clock C and the second chopping clock Cb.

To further illustrate the operation of the two chopping sub-circuits 130 and 150, an example is provided below. For both chopping sub-circuits 130 and 150, the chopping switches (transistors) are driven by the chopping clock C or Cb in two chopping phases. In chopping phase 1, all chopping switch transistors driven by the chopping clock C are in an ON state and all chopping switch transistors driven by the chopping clock Cb are in an OFF state. In this phase, a positive clock Q (to allow a current flow through M2a) passes through the first switch transistor M3a to combine with positive clock I (to allow a current flow through M4a), and further passes through the fifth switch transistor M5a so that a current signal flows through the first load 160 on the left-hand side of the circuit 100. In the same phase, a negative clock Qb (to allow a current flow through M2b) passes through the fourth witch transistor M3d to combine with negative clock Ib (to allow a current flow through M4c), and further passes through the fifth switch transistor M5a so that a current signal flows through the first load 160 on the left-hand side of the circuit 100. Alternatively, in the same phase, a positive clock Q passes through the first switch transistor M3a to combine with negative clock Ib (to allow a current flow through M4b), and further passes through the eighth switch transistor M5d so that a current signal flows through the second load 170 on the right-hand side of the circuit 100. Further, in the same phase, a negative clock Qb (to allow a current flow through M2b) passes through the fourth witch transistor M3d to combine with positive clock I (to allow a current flow through M4d), and further passes through the eighth switch transistor M5d so that a current signal flows through the second load 170 on the right-hand side of the circuit 100.

In chopping phase 2, all chopping switch transistors driven by the chopping clock Cb are in an ON state and all chopping switch transistors driven by the chopping clock C are in an OFF state. In this phase, a positive clock Q (to allow a current flow through M2a) passes through the third switch transistor M3c to combine with negative clock Ib (to allow a current flow through M4c), and further passes through the sixth switch transistor M5b so that a current signal flows through the second load 170 on the right-hand side of the circuit 100. In the same phase, a negative clock Qb (to allow a current flow through M2b) passes through the second witch transistor M3b to combine with positive clock I (to allow a current flow through M4a), and further passes through the sixth switch transistor M5b so that a current signal flows through the second load 170 on the right-hand side of the circuit 100. Alternatively, in the same phase, a positive clock Q passes through the third switch transistor M3c to combine with positive clock I (to allow a current flow through M4d), and further passes through the seventh switch transistor M5c so that a current signal flows through the first load 160 on the left-hand side of the circuit 100. Further, in the same phase, a negative clock Qb (to allow a current flow through M2b) passes through the second witch transistor M3b to combine with negative clock Ib (to allow a current flow through M4b), and further passes through the seventh switch transistor M5c so that a current signal flows through the first load 160 on the left-hand side of the circuit 100. Optionally, the current signal through the first load 160 or the second load 170 can be converted to an output voltage signal Von or Vop for detecting quadrature phase error in the I clock and Q clock.

In the embodiment, whenever the Q clock and the I clock are all positive or the Qb clock and the Ib clock are all positive, a current signal flows through the first load 160 on the left-hand side and no current flows through the second load 170 on the right-hand side. Whenever either one and only one of the Q clock and the I clock is negative or either one and only one of the Qb clock and the Ib clock is negative, no current flows through the first load 160 on the left hand side and a current signal flows through the second load 170 on the right hand side. This applies to the two chopping phases with both operations of chopping sub-circuits 130 and 150 matching the truth table of FIG. 3. The device offsets, if any, in (M2a and M2b of) the bottom differential-pair sub-circuit 120 and in (M4a and M4c of) the top differential-pair sub-circuit 140 have opposite effect of those offsets in (M2a and M2b of) the bottom differential-pair sub-circuit 120 and in (M4b and M4d of) the top differential-pair sub-circuit 140 during the two chopping phases of the chopping clocks. By averaging the two chopping phases, the functionalities of XOR gate remain the same as no chopping, and yet the errors generated by the offsets pass evenly through the first load 160 on the left and the second load 170 on the right side, and eventually average out, as long as that the chopping phase 1 and chopping phase 2 matches. When the output voltage is averaged over time, the effects of the device offsets cancel out when chopping clock maintain a 50% duty cycle.

The XOR-gate quadrature detector 100 can be implemented with relatively low current consumption since the operation is performed in current mode not voltage mode. Also, the XOR-gate quadrature detector 100 is configured to only use differential DC current of the XOR to detect quadrature clock phase.

Figure 6:
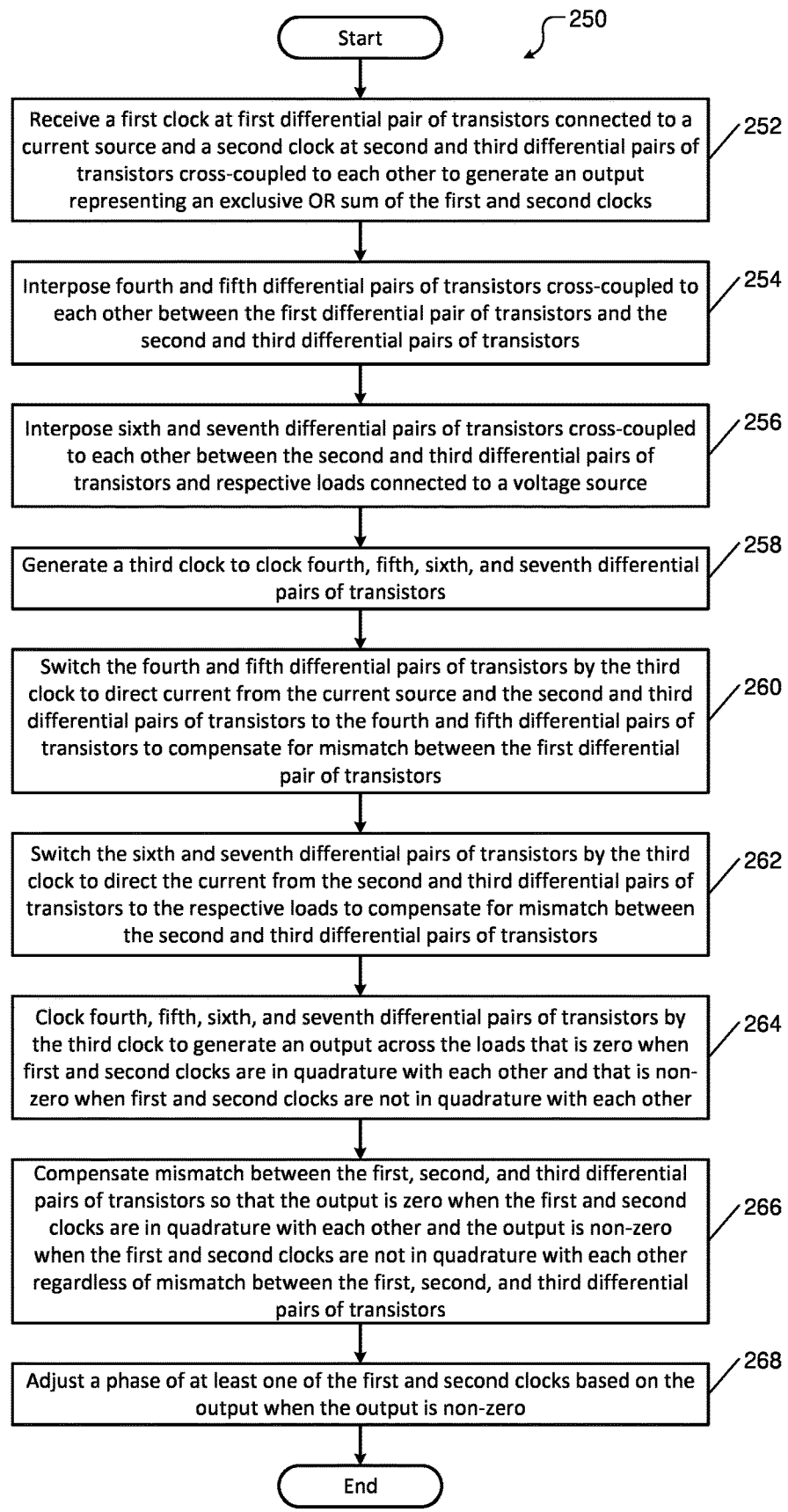
FIG. 6 is a flowchart of a method for compensating device mismatch in the XOR-gate-based quadrature phase detector of FIG. 5B.

FIG. 6 is a flowchart of a method 250 for compensating device mismatch in the XOR-gate-based quadrature phase detector of FIG. 5B. For example, the method 250 can be performed by the XOR-gate quadrature detector 100. At 252, a first clock (Q) and a second clock (I) are received at a plurality of differential pairs of transistors (M2a, M2b; M4a-M4d) to generate an output representing an exclusive OR sum of the first and second clocks. The plurality of differential pairs of transistors comprises first, second, and third differential pairs of transistors.

The first clock is received at the first differential pair of transistors (M2a, M2b) connected to a current source. The second clock is received at the second and third differential pairs of transistors (M4a-M4d) cross-coupled to each other. The method 250 compensates mismatch between the plurality of differential pairs of transistors as follows so that the output is zero when the first and second clocks are in quadrature with each other and the output is non-zero when the first and second clocks are not in quadrature with each other regardless of mismatch between the plurality of differential pairs of transistors.

At 254, fourth and fifth differential pairs of transistors (M3a-M3d) cross-coupled to each other are interposed between the first differential pair of transistors and the second and third differential pairs of transistors. At 256, sixth and seventh differential pairs of transistors (M5a-M5d) cross-coupled to each other are interposed between the second and third differential pairs of transistors and respective loads connected to a voltage source.

At 258, a third clock (C) is generated to clock the fourth, fifth, sixth, and seventh differential pairs of transistors. The first and second clocks have frequencies that are different from a frequency of the third clock input to the fourth, fifth, sixth, and seventh differential pairs of transistors. For example, the clock generator 200 generates the third clock C such that the frequency of the I clock and the Q clock is an integer multiple of the frequency of the third clock C. For example, the clock generator 200 generates the third clock (C) having a 50% duty cycle and a slower frequency than the I clock and the Q clock.

At 260, the fourth and fifth differential pairs of transistors are switched by the third clock to direct current from the current source and the second and third differential pairs of transistors to the fourth and fifth differential pairs of transistors to compensate for mismatch between the first differential pair of transistors. At 262, the sixth and seventh differential pairs of transistors are switched by the third clock to direct the current from the second and third differential pairs of transistors to the respective loads to compensate for mismatch between the second and third differential pairs of transistors. At 264, the fourth, fifth, sixth, and seventh differential pairs of transistors are clocked by the third clock to generate an output across the loads (L1 and L2) that is zero when the first and second clocks are in quadrature with each other and that is non-zero when the first and second clocks are not in quadrature with each other regardless of mismatch between the first differential pair of transistors and regardless of mismatch between the second and third differential pairs of transistors.

At 266, the method 250 compensates mismatch between first, second, and third differential pairs of transistors so that the output is zero when the first and second clocks are in quadrature with each other and the output is non-zero when the first and second clocks are not in quadrature with each other regardless of mismatch between the first differential pair of transistors and regardless of mismatch between the first, second, and third differential pairs of transistors. At 268, the method 250 adjusts a phase of at least one of the first and second clocks based on the output when the output is non-zero.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It is noted that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

What is claimed is:

1. A circuit comprising:
   a plurality of differential pairs of transistors configured to receive a first clock and a second clock and to generate a differential output, wherein the plurality of differential pairs of transistors comprises:
   a first differential pair of transistors configured to output first and second signals; and
   second and third differential pairs of transistors cross-coupled to each other and configured to output third and fourth signals; and
   circuitry connected to the plurality of differential pairs of transistors, the circuitry comprising:
   fourth and fifth differential pairs of transistors cross-coupled to each other and configured to, based on a third clock, route the first signal through one transistor in each of the fourth and fifth differential pairs of transistors and to route the second signal through the other transistor in each of the fourth and fifth differential pairs of transistors; and
   sixth and seventh differential pairs of transistors cross-coupled to each other and configured to, based on the third clock, route the third signal through one transistor in each of the sixth and seventh differential pairs of transistors and to route the fourth signal through the other transistor in each of the sixth and seventh differential pairs of transistors;
   wherein the circuitry is configured to compensate for mismatch between the plurality of differential pairs of transistors due to process variations so that the differential output averaged over a plurality of clock periods is zero when the first and second clocks are in quadrature with each other and the differential output averaged over a plurality of clock periods is non-zero when the first and second clocks are not in quadrature with each other regardless of the mismatch between the plurality of differential pairs of transistors.

2. The circuit of claim 1 wherein:
the first differential pair of transistors is connected to a current source and configured to receive the first clock; and
the second and third differential pairs of transistors are configured to receive the second clock;
the fourth and fifth differential pairs of transistors are interposed between the first differential pair of transistors and the second and third differential pairs of transistors and are clocked by the third clock;
the sixth and seventh differential pairs of transistors are interposed between the second and third differential pairs of transistors and respective loads connected to a voltage source and are clocked by the third clock; and
the third clock clocks the fourth, fifth, sixth, and seventh differential pairs of transistors to generate the differential output across the loads that is zero when the first and second clocks are in quadrature with each other and that is non-zero when the first and second clocks are not in quadrature with each other.

3. The circuit of claim 2 wherein the third clock clocks the fourth, fifth, sixth, and seventh differential pairs of transistors to generate the differential output across the loads that is zero indicating that the first and second clocks are in quadrature with each other and that is non-zero indicating that the first and second clocks are not in quadrature with each other regardless of mismatch between the first differential pair of transistors.

4. The circuit of claim 2 wherein the third clock clocks the fourth, fifth, sixth, and seventh differential pairs of transistors to generate the differential output across the loads that is zero when the first and second clocks are in quadrature with each other and that is non-zero when the first and second clocks are not in quadrature with each other regardless of mismatch between the second and third differential pairs of transistors.

5. The circuit of claim 2 wherein the third clock switches the fourth and fifth differential pairs of transistors to direct current from the current source and the second and third differential pairs of transistors to the fourth and fifth differential pairs of transistors to compensate for mismatch between the first differential pair of transistors.

6. The circuit of claim 2 wherein the third clock switches the sixth and seventh differential pairs of transistors to direct the current from the second and third differential pairs of transistors to the respective loads to compensate for mismatch between the second and third differential pairs of transistors.

7. The circuit of claim 2 wherein the first clock input to the first differential pair of transistors and the second clock input to the second and third differential pairs of transistors have respective frequencies that are different from a frequency of the third clock input to the fourth, fifth, sixth, and seventh differential pairs of transistors.

8. The circuit of claim 2 further comprising a clock generator configured to generate the third clock having a 50% duty cycle and a slower frequency than the first and second clocks.

9. The circuit of claim 2 further comprising a clock generator configured to generate the third clock so that the first and second clocks have a frequency that is an integer multiple of a frequency of the third clock.

10. The circuit of claim 1 further comprising a calibration circuit configured to adjust a phase of at least one of the first and second clocks based on the differential output when the differential output is non-zero.

11. The method of claim 1 further comprising:
receiving the first clock at the first differential pair of transistors connected to a current source;
receiving the second clock at the second and third differential pairs of transistors;
interposing fourth and fifth differential pairs of transistors between the first differential pair of transistors and the second and third differential pairs of transistors;
clocking the fourth and fifth differential pairs of transistors by the third clock; and
interposing sixth and seventh differential pairs of transistors between the second and third differential pairs of transistors and respective loads connected to a voltage source;
clocking the sixth and seventh differential pairs of transistors by the third clock; and
clocking the fourth, fifth, sixth, and seventh differential pairs of transistors by the third clock to generate the differential output across the loads that is zero when the first and second clocks are in quadrature with each other and that is non-zero when the first and second clocks are not in quadrature with each other.

12. The method of claim 11 further comprising clocking the fourth, fifth, sixth, and seventh differential pairs of transistors by the third clock to generate the differential output across the loads that is zero indicating that the first and second clocks are in quadrature with each other and that is non-zero indicating that the first and second clocks are not in quadrature with each other regardless of mismatch between the first differential pair of transistors.

13. The method of claim 11 further comprising clocking the fourth, fifth, sixth, and seventh differential pairs of transistors by the third clock to generate the differential output across the loads that is zero when the first and second clocks are in quadrature with each other and that is non-zero when the first and second clocks are not in quadrature with each other regardless of mismatch between the second and third differential pairs of transistors.

14. The method of claim 11 further comprising switching the fourth and fifth differential pairs of transistors by the third clock to direct current from the current source and the second and third differential pairs of transistors to the fourth and fifth differential pairs of transistors to compensate for mismatch between the first differential pair of transistors.

15. The method of claim 11 further comprising switching the sixth and seventh differential pairs of transistors by the third clock to direct the current from the second and third differential pairs of transistors to the respective loads to compensate for mismatch between the second and third differential pairs of transistors.

16. The method of claim 11 further comprising supplying the first clock to the first differential pair of transistors and the second clock to the second and third differential pairs of transistors having respective frequencies that are different from a frequency of the third clock input to the fourth, fifth, sixth, and seventh differential pairs of transistors.

17. The method of claim 11 further comprising generating the third clock having a 50% duty cycle and a slower frequency than the first and second clocks.

18. The method of claim 11 further comprising generating the third clock so that the first and second clocks have a frequency that is an integer multiple of a frequency of the third clock.

19. The method of claim 11 further comprising adjusting a phase of at least one of the first and second clocks based on the differential output when the output is non-zero.

20. A method for mismatch compensation comprising:
receiving a first clock and a second clock at a plurality of differential pairs of transistors to generate a differential output, wherein the plurality of differential pairs of transistors comprises first, second, and third differential pairs of transistors;
a first differential pair of transistors configured to output first and second signals;
second and third differential pairs of transistors cross-coupled to each other and configured to output third and fourth signals;
fourth and fifth differential pairs of transistors cross-coupled to each other and configured to, based on a third clock, route the first signal through one transistor in each of the fourth and fifth differential pairs of transistors and to route the second signal through the other transistor in each of the fourth and fifth differential pairs of transistors; and
sixth and seventh differential pairs of transistors cross-coupled to each other and configured to, based on the third clock, route the third signal through one transistor in each of the sixth and seventh differential pairs of transistors and to route the fourth signal through the other transistor in each of the sixth and seventh differential pairs of transistors; and
compensating mismatch between the plurality of differential pairs of transistors due to process variations so that the differential output averaged over a plurality of clock periods is zero when the first and second clocks are in quadrature with each other and the differential output averaged over a plurality of clock periods is non-zero when the first and second clocks are not in quadrature with each other regardless of mismatch between the plurality of differential pairs of transistors.

* * * * *